United States Patent
Maruyama

(10) Patent No.: US 10,424,522 B2
(45) Date of Patent: Sep. 24, 2019

(54) CASE, SEMICONDUCTOR DEVICE AND MANUFACTURING METHOD OF CASE

(71) Applicant: FUJI ELECTRIC CO., LTD., Kanagawa (JP)

(72) Inventor: Rikihiro Maruyama, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/905,753

(22) Filed: Feb. 26, 2018

(65) Prior Publication Data
US 2018/0182678 A1    Jun. 28, 2018

Related U.S. Application Data

(63) Continuation of application No. PCT/JP2017/004460, filed on Feb. 7, 2017.

(30) Foreign Application Priority Data

Mar. 22, 2016    (JP) .................. 2016-056505

(51) Int. Cl.
*H01L 23/053*    (2006.01)
*H01L 23/08*    (2006.01)
(Continued)

(52) U.S. Cl.
CPC ........ *H01L 23/053* (2013.01); *H01L 21/4817* (2013.01); *H01L 21/50* (2013.01);
(Continued)

(58) Field of Classification Search
CPC ..... H01L 23/02; H01L 23/041; H01L 23/043; H01L 23/045; H01L 23/051;
(Continued)

(56) References Cited

U.S. PATENT DOCUMENTS 9,622,131 B2    4/2017  Koskela et al.
2002/0179921 A1* 12/2002  Cohn .................. B81B 7/0051
                                                                257/99
(Continued)

FOREIGN PATENT DOCUMENTS

CN    102783211 A    11/2012
CN    102790993 A    11/2012
(Continued)

OTHER PUBLICATIONS

International Search Report for International Patent Application No. PCT/JP2017/004460, issued by the Japan Patent Office dated May 9, 2017.

(Continued)

*Primary Examiner* — Eduardo A Rodela

(57) ABSTRACT

A case and a semiconductor device including the case are provided for solving the following issues: when fixing a lid body to a case body by an adhesive, a process of attaching the lid body to the case body by applying the adhesive and curing the adhesive by heating is necessary, which requires much labor; also, when fixing the lid body to the case body by an engaging claw, it still requires much labor due to forming the engaging claw. The case includes a first member and a second member that is engaged with the first member to form an accommodation space inside the case, and the first member has a protruding portion extending from the first member side toward the second member side and having an end portion crushed from the opposite side of the first member to fix the second member to the first member.

17 Claims, 15 Drawing Sheets

(51) Int. Cl.
| | |
|---|---|
| *H01L 23/14* | (2006.01) |
| *H01L 23/48* | (2006.01) |
| *H01L 23/02* | (2006.01) |
| *H01L 23/28* | (2006.01) |
| *H01L 21/48* | (2006.01) |
| *H01L 23/04* | (2006.01) |
| *H01L 23/31* | (2006.01) |
| *H01L 23/00* | (2006.01) |
| *H01L 23/055* | (2006.01) |
| *H01L 23/10* | (2006.01) |
| *H01L 21/50* | (2006.01) |
| *H05K 7/14* | (2006.01) |
| *H01L 23/373* | (2006.01) |
| *H02M 7/00* | (2006.01) |
| *H02M 7/537* | (2006.01) |
| *H02P 27/06* | (2006.01) |

(52) U.S. Cl.
CPC ............ *H01L 23/02* (2013.01); *H01L 23/041* (2013.01); *H01L 23/055* (2013.01); *H01L 23/08* (2013.01); *H01L 23/10* (2013.01); *H01L 23/145* (2013.01); *H01L 23/28* (2013.01); *H01L 23/3114* (2013.01); *H01L 23/48* (2013.01); *H01L 24/32* (2013.01); *H05K 7/1432* (2013.01); *H01L 23/3735* (2013.01); *H01L 2224/32225* (2013.01); *H01L 2924/1203* (2013.01); *H01L 2924/13055* (2013.01); *H01L 2924/14252* (2013.01); *H01L 2924/19107* (2013.01); *H02M 7/003* (2013.01); *H02M 7/537* (2013.01); *H02P 27/06* (2013.01)

(58) Field of Classification Search
CPC ..... H01L 23/053; H01L 23/055; H01L 23/08; H01L 23/145; H01L 23/147; H01L 23/48; H01L 23/49; H01L 23/498; H01L 23/49827

See application file for complete search history.

(56) References Cited

U.S. PATENT DOCUMENTS

| | | | |
|---|---|---|---|
| 2003/0015778 A1* | 1/2003 | Soyano | H01L 23/045 257/678 |
| 2003/0183921 A1* | 10/2003 | Komobuchi | B81B 7/0077 257/704 |
| 2005/0198654 A1 | 9/2005 | Muta et al. | |
| 2005/0263529 A1 | 12/2005 | Fukumoto et al. | |
| 2006/0115323 A1* | 6/2006 | Coppeta | A61K 9/0097 403/270 |
| 2008/0231145 A1* | 9/2008 | Nagano | B22F 1/0074 310/344 |
| 2009/0039494 A1* | 2/2009 | Kroneder | H01L 21/4878 257/687 |
| 2010/0006315 A1* | 1/2010 | Kumatani | H03H 9/0528 174/50.5 |
| 2010/0187007 A1 | 7/2010 | Trenner et al. | |
| 2012/0235308 A1* | 9/2012 | Takahashi | H01L 21/50 257/777 |
| 2014/0210064 A1* | 7/2014 | Lopez | H01L 24/85 257/676 |
| 2016/0118310 A1 | 4/2016 | Maruyama | |
| 2016/0311677 A1* | 10/2016 | Ogashiwa | B81C 1/00269 |

FOREIGN PATENT DOCUMENTS

| | | |
|---|---|---|
| JP | H04-342158 A | 11/1992 |
| JP | H04-359547 A | 12/1992 |
| JP | 2005-251320 A | 9/2005 |
| JP | 2005-340700 A | 12/2005 |
| JP | 2007-036896 A | 2/2007 |
| JP | 2009-130169 A | 6/2009 |
| JP | 2010-521823 A | 6/2010 |
| WO | 2012/088471 A1 | 6/2012 |
| WO | 2015107804 A1 | 7/2015 |

OTHER PUBLICATIONS

Office Action issued for counterpart Japanese Application No. 2018-507107, by the Japan Patent Office dated Feb. 5, 2019(drafted on Jan. 28, 2019).

Office Action dated May 18, 2018 in connection with Chinese Patent Application No. 201480040844.7.

\* cited by examiner

CASE, SEMICONDUCTOR DEVICE AND MANUFACTURING METHOD OF CASE

The contents of the following Japanese patent application are incorporated herein by reference:
NO. 2016-056505 filed in JP on Mar. 22, 2016 and PCT/JP2017/004460 filed on Feb. 7, 2017.

BACKGROUND

1. Technical Field

The present invention relates to a case, a semiconductor device, and a manufacturing method of the case.

2. Related Art

An apparatus has been known, in which a plurality of power semiconductor elements are accommodated in a case made of resin. This case includes a box-shaped case body having an aperture to accommodate a semiconductor element, and a lid body covering the aperture. These case body and lid body are fixed to each other by an adhesive, an engaging claw, or a bolt (for example, refer to Patent documents 1 and 2).
[Patent document 1] Japanese Patent Application, Publication No. H4-342158
[Patent document 2] Japanese Patent Application, Publication No. 20 07-36896
[Patent document 3] Japanese Patent Application, Publication No. 20 09-130169

However, in a case of fixing a lid body to a case body by the adhesive, a process of attaching the lid body to the case body by applying the adhesive and curing the adhesive by heating and the like is necessary, which requires a lot of labor for manufacturing the apparatus. Also, in a case of fixing the lid body to the case body by the engaging claw, it stills requires a lot of labor for manufacturing the apparatus due to a process of forming the engaging claw that is in a fine shape.

SUMMARY (Item 1) In a first aspect of the present invention, a case is provided. The case may include a first member. The case may include a second member that is engaged with the first member to form an accommodation space inside the case. The first member may have a protruding portion that extends from the first member side toward the second member side and has an end portion crushed from an opposite side of the first member to fix the second member to the first member.

(Item 2) The first member may be a case body that has an aperture of the accommodation space. The second member may be a lid body that covers the aperture.

(Item 3) The protruding portion may be provided corresponding to at least a part of an outer edge portion of the second member.

(Item 4) The second member may have a notched portion for passing the protruding portion therethrough on a side of the outer edge portion of the second member.

(Item 5) The second member may have a notched portion for passing the protruding portion therethrough in a corner portion of the outer edge portion of the second member.

(Item 6) A shape of the notched portion when viewed from the opposite side of the first member may be either a polygonal shape or a partially circular shape.

(Item 7) The protruding portion may surround an entire outer periphery of the second member.

(Item 8) The second member may have a through hole to pass the protruding portion therethrough.

(Item 9) A shape of the through hole when viewed from the opposite side of the first member may be either a polygonal shape or a circular shape.

(Item 10) The second member may have, at least in a part of a position adjacent to the protruding portion on the opposite side of the first member, a locking surface that is locked by the end portion of the protruding portion, the end portion crushed from the opposite side of the first member.

(Item 11) The second member may have a locking surface in a plurality of portions in the position adjacent to the protruding portion on the opposite side of the first member.

(Item 12) The second member may have, at least in a part of the position adjacent to the protruding portion, a clearance portion to accommodate the end portion of the protruding portion, the end portion crushed from the opposite side of the first member.

(Item 13) The end portion of the protruding portion, which is crushed from the opposite side of the first member, may be formed flush with a portion in a position adjacent to the protruding portion of the portion of the second member on the opposite side of the first member.

(Item 14) The first member may be a case body that has a frame portion provided on the aperture of the accommodation space to accommodate the second member. The second member may be a lid body that is fit to the frame portion to cover the accommodation space. The protruding portion may extend along an inner surface of the frame portion.

(Item 15) The protruding portion may be formed of thermoplastic resin.

(Item 16) In a second aspect of the present invention, a semiconductor device is provided. The semiconductor device may include the case of the first aspect. The semiconductor device may include a substrate that is accommodated in the accommodation space of the case. The semiconductor device may include a semiconductor element that is mounted on the substrate.

(Item 17) The semiconductor device may further include a gel material to seal an upper side of the substrate within the accommodation space.

(Item 18) In a third aspect of the present invention, a manufacturing method of a case is provided. The manufacturing method of the case may include a step of preparing (for example, manufacturing) a first member, and a second member that is engaged with the first member to form an accommodation space inside the case. The manufacturing method of the case may include a step of fitting the second member to the first member. The manufacturing method of the case may include a step of fixing the second member to the first member by crushing an end portion of a protruding portion provided on the first member and extending from the first member side to the second member side, the end portion protruding on a surface of the second member on the opposite side of the first member.

(Item 19) The step of fixing the second member to the first member may include crushing the end portion by at least one of ultrasonic excitation and heating.

(Item 20) The step of preparing the first member and the second member may include forming a tapered top portion on the end portion before the crushing.

The summary clause does not necessarily describe all necessary features of the embodiments of the present invention. The present invention may also be a sub-combination of the features described above.

BRIEF DESCRIPTION OF THE DRAWINGS

FIG. 4 (b) is a drawing for describing the fixation of a first member and a second member.

FIG. 4 (c) is a drawing for describing the fixation of a first member and a second member.

FIG. 4 (d) is a drawing for describing the fixation of a first member and a second member.

FIG. 7 (b) is a side view of the protruding portion in the variation (1).

FIG. 8 (b) is a drawing showing the notched portion in the variation (2).

FIG. 8 (c) is a drawing showing the notched portion in the variation (2).

FIG. 9 (b) is a drawing showing the notched portion in the variation (3).

FIG. 10 (b) is a drawing showing the notched portion in the variation (4).

FIG. 10 (c) is a drawing showing the notched portion in the variation (4).

FIG. 12 (b) is a drawing showing the second member in the variation (6).

FIG. 12 (c) is a drawing showing the second member in the variation (6).

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

The case according to the present embodiment includes a first member and a second member, which are engaged with each other to form an accommodation space inside the case. The first member has a protruding portion extending toward the second member side, and this protruding portion has an end portion that is crushed from an opposite side of the first member to fix the second member to the first member. Accordingly, it is possible to fix the second member to the first member simply by crushing the end portion of the protruding portion.

[1. Case]

Figure 1:
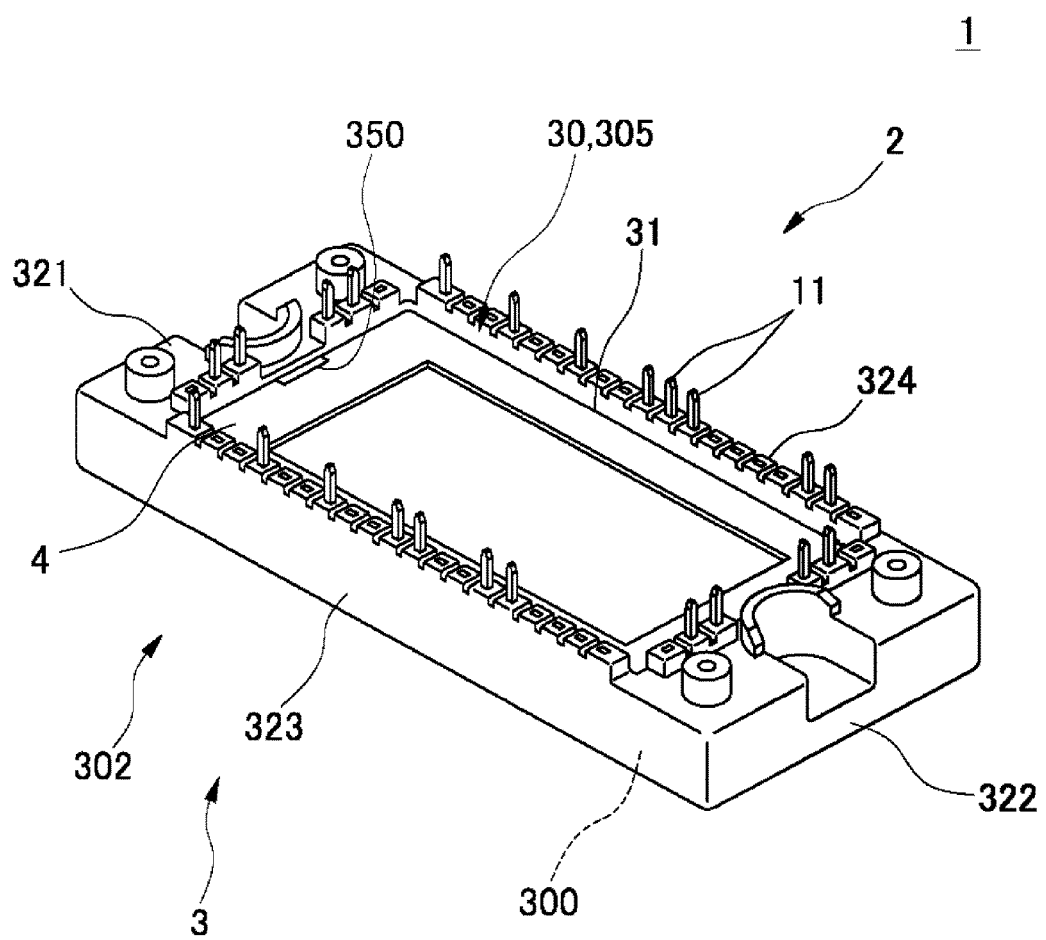
FIG. 1 is a perspective view of a case according to the present embodiment.
Figure 2:
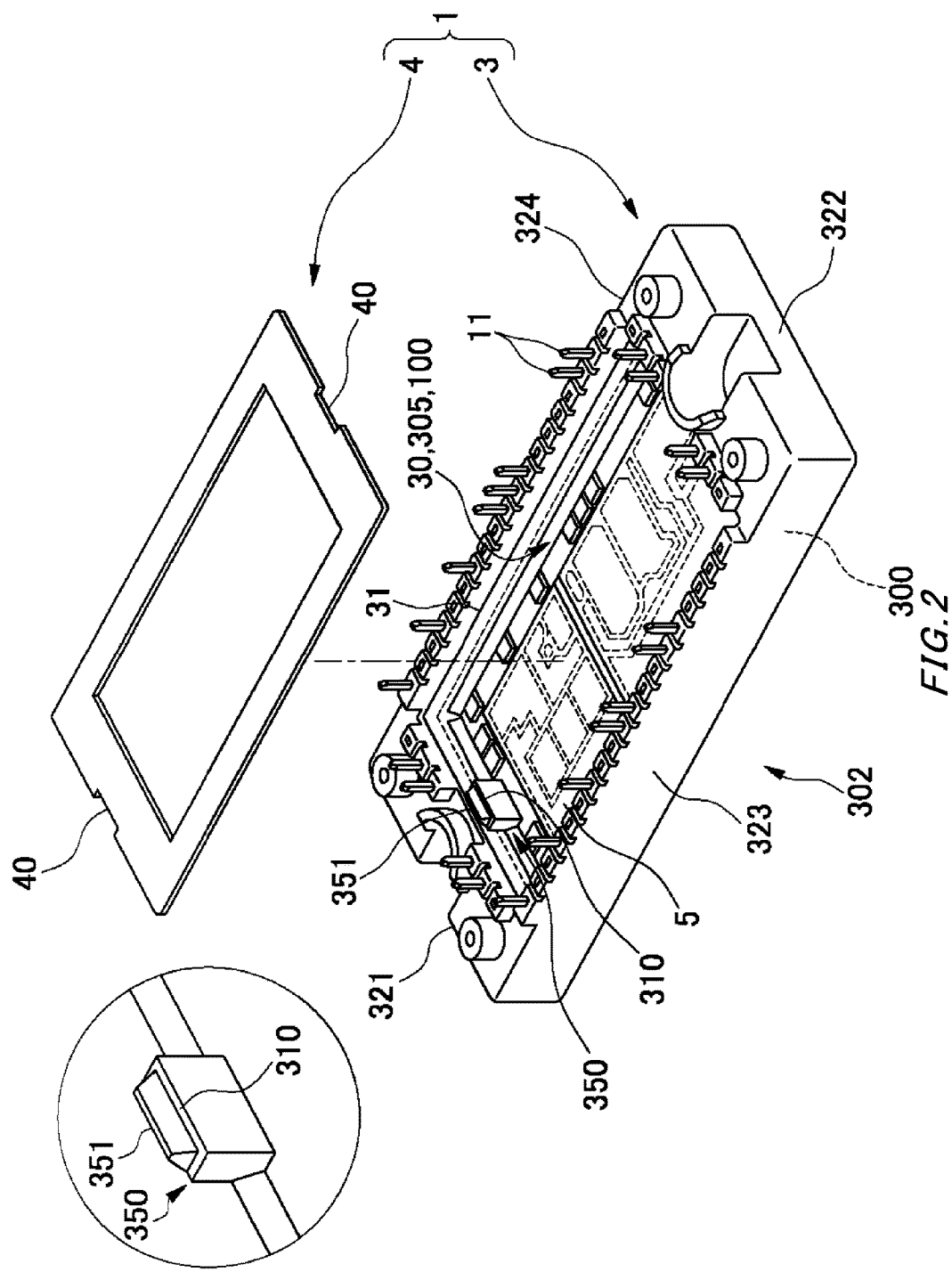
FIG. 2 is an exploded perspective view of the case according to the present embodiment.

FIG. 1 is a perspective view of a case 2 according to the present embodiment. Also, FIG. 2 is an exploded perspective view of the case 2 according to the present embodiment. It should be noted that an illustration of a semiconductor element 6 and the like which are described below is omitted in FIG. 2.

The case 2 includes a first member 3 and a second member 4 that is engaged with the first member 3 to form an accommodation space 100 inside the case. For example, the case 2 may be formed in a box shape or a frame shape having the accommodation space 100 inside according to these first member 3 and second member 4, or may be formed in a flat rectangular parallelepiped shape, as one example. Also, the case 2 may be entirely formed of resin. For the resin, any one resin selected from the followings can be used: polybutylene terephthalate (PBT), polybutyl acrylate (PBA), polyphenylene sulfide (PPS), polyamide (PA) and acrylonitrile-butadiene-styrene (ABS), and the like, for example. In this resin, a filler (for example, a glass filler) for improving an intensity and/or a functionality may be included.

[1-1. First Member]

The first member 3 may be a case body that has an aperture 30 of the accommodation space 100. The aperture 30 is a portion opened on the second member 4 side of the accommodation space 100 formed by the first member 3. As one example, the first member 3 may be a frame or a box positioned on a lower portion of the case 2.

For example, the first member 3 may have an annular peripheral wall portion 302 that forms the aperture 30. The peripheral wall portion 302 has a first side portion 321, a second side portion 322, a third side portion 323, and a fourth side portion 324, and among the above, the first side portion 321 and the second side portion 322 face each other, and are preferably parallel to each other. Also, the third side portion 323 and the fourth side portion 324 face each other, and are preferably parallel to each other. In the present embodiment, the first side portion 321 and the second side portion 322 are shorter than the third side portion 323 and the fourth side portion 324. A terminal 11 electrically connected to the below-described semiconductor element 6 and the like may be embedded in these first side portion 321 to the fourth side portion 324.

Also, preferably, the first member 3 may have a frame portion 31 that is provided on the aperture 30 of the accommodation space 100 to accommodate the second member 4. For example, in an inner peripheral portion of the peripheral wall portion 302, the frame portion 31 may be formed in a shape corresponding to an outer shape of the second member 4 such that the second member 4 is fit to the inner side.

The above first member 3 has a protruding portion 350 that extends from the first member 3 side toward the second member 4 side. Here, that extending from the first member 3 side toward the second member 4 side may be that extending in a direction parallel to or approximately parallel to a depth direction of the accommodation space 100, a height direction of the peripheral wall portion 302, or the like. As one example, the protruding portion 350 may extend along the inner surface of the frame portion 31. More specifically, the protruding portion 350 may extend in a state of being separated from the inner surface of the frame portion 31, or may be extend in a state of being in contact with the inner surface of the frame portion 31 or an integrated state of being with the inner surface.

One or more of the protruding portions 350 may be provided corresponding to at least a part of the outer edge portion of the second member 4; for example, two protruding portions 350 may be provided in opposite positions facing each other among respective positions within the frame portion 31. As one example, one protruding portions 350 is provided on each of the first side portion 321 and the second side portion 322. More specifically, on a midway portion of the first side portion 321 and the second side portion 322, a counterbore portion 310 for placing the second member 4 may be respectively formed on a lower portion of the inner peripheral portion of the frame portion 31, and the protruding portion 350 may be provided on an upper surface of this counterbore portion 310. However, the protruding portion 350 may be provided on the upper surface of the peripheral wall portion 302, or may be provided on a bottom surface of the accommodation space 100 (for example, an upper surface of a heat radiation plate 10 that is described below), or may be provided protruding from the inner peripheral surface of the peripheral wall portion 302 (for example, the inner peripheral surface of the frame portion 31) toward the inner side.

Such a protruding portion 350 has an end portion 351 exposed on an opposite side of the first member 3 (the upper side in the drawing; also referred to as an upper-surface side, as one example) via a notched portion 40 or a through hole 400, which are described below, in the second member 4 in a state in which the first member 3 and the second member 4 have formed the accommodation space 100. Also, the protruding portion 350 has the end portion 351 crushed from the upper-surface side such that the second member 4 is fixed to the first member 3. It should be noted that the fixation of the first member 3 and the second member 4 is described below in detail by using FIG. 4 (a) to FIG. 4 (d).

Such a protruding portion 350 may be formed of one thermoplastic resin selected from polybutylene terephthalate (PBT), polybutyl acrylate (PBA), polyphenylene sulfide (PPS), polyamide (PA) and acrylonitrile-butadiene-styrene (ABS), and the like, for example. In this resin, a filler (for example, a glass filler) for improving the intensity and/or functionality may also be included. Preferably, the protruding portion 350 is integrally formed of the same resin material as the resin material of which the first member 3 is formed. However, the protruding portion 350 may be formed of metal such as a solder.

[1-2. Second Member]

The second member 4 may be a lid body to cover the aperture 30 of the accommodation space 100, and preferably, is fit to the frame portion 31 of the first member 3 to cover the accommodation space 100. For example, the second member 4 is formed in a rectangular plate shape.

This second member 4 may have, on a side of the outer edge portion, a notched portion 40 for passing the protruding portion 350 therethrough. Accordingly, for example, by causing the first member 3 and the second member 4 to face each other so as to pass the protruding portion 350 through the notched portion 40, the first member 3 and the second member 4 may be fit to each other. A shape of the notched portion 40 when viewed from the upper-surface side, that is, a shape of a top surface view, may be a polygonal shape, and as one example, is a square shape.

The above notched portion 40 is set to be engaged with the protruding portion 350 in order to fix the second member 4 to the first member 3. The fixation of the first member 3 and the second member 4 is described below in detail by using FIG. 4 (a) to FIG. 4 (d).

[2. Semiconductor Device]

The accommodation space 100 of the case 2 described above may accommodate one or more substrates 5 and one or more semiconductor elements 6 mounted on the one or more substrates 5. Accordingly, a semiconductor device 1, which includes the case 2, the substrate 5, and the semiconductor element 6, is formed. As one example, the semiconductor device 1 may be an IGBT module, a power module, or the like, with the built-in semiconductor element 6 that is a transistor such as an IGBT or a vertical MOSFET, or a diode such as a FWD. As one example of such an IGBT module and the like, an inverter device to drive a motor is given.

Figure 3:
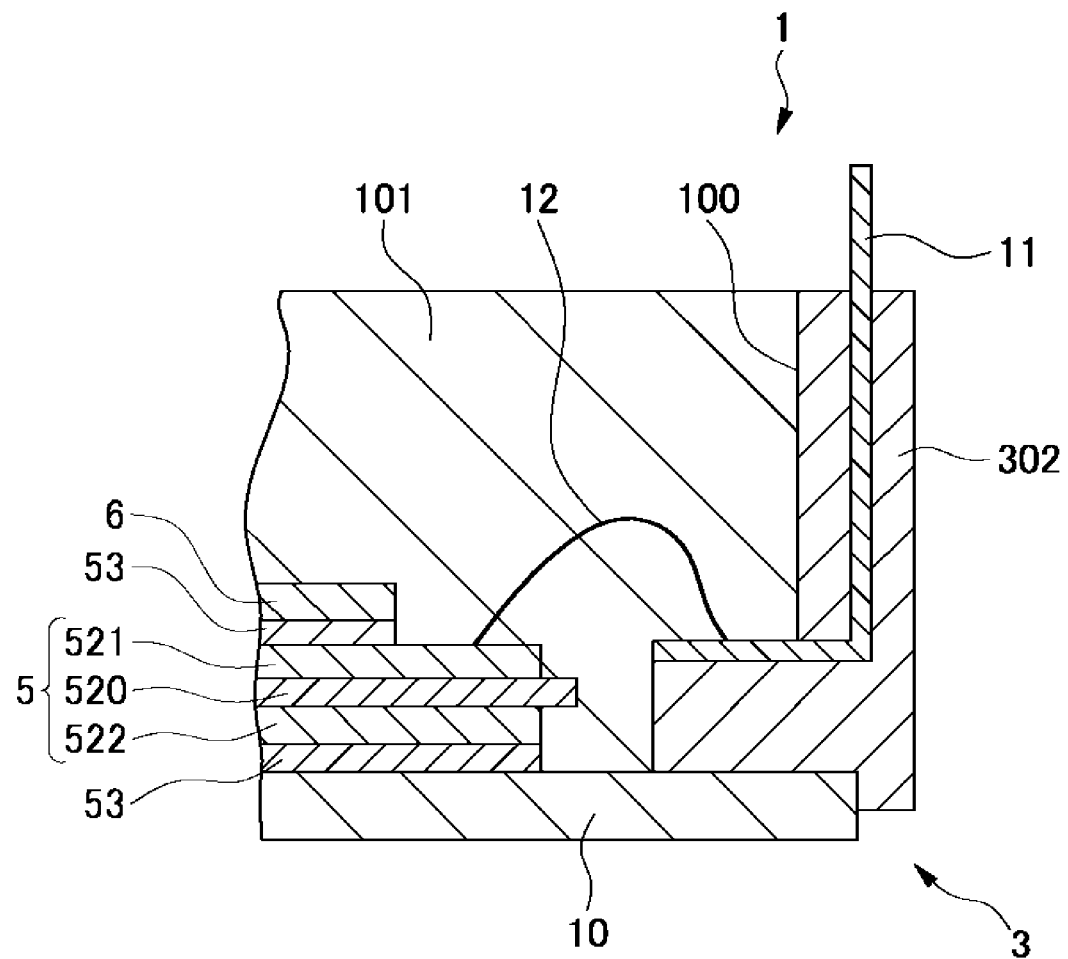
FIG. 3 is a cross-sectional view showing a state in which a substrate and a semiconductor element are accommodated within a case in a semiconductor device according to the present embodiment.
Figure 4A:
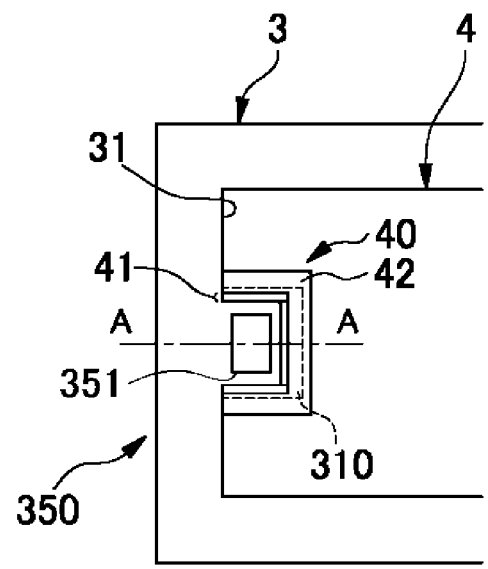
FIG. 4 (a) is a drawing for describing a fixation of a first member and a second member.
Figure 4B:
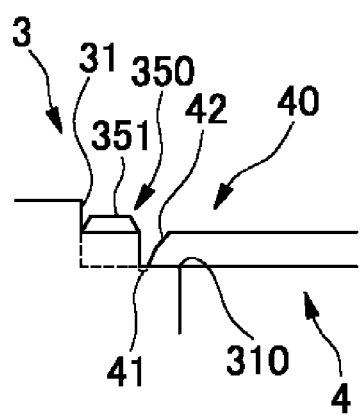
Figure 4C:
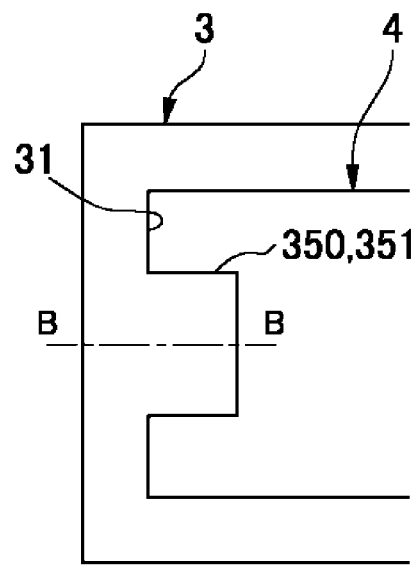
Figure 4D:
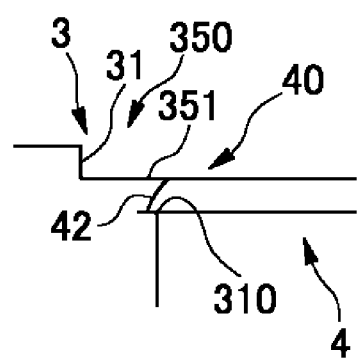

FIG. 3 is a cross-sectional view showing a state in which the substrate 5 and the semiconductor element 6 are accommodated within the case 2 in the semiconductor device 1 according to the present embodiment. As shown in this drawing, the semiconductor device 1 may have a heat radiation plate 10, a terminal 11, a bonding wire 12, and the like, in addition to the substrate 5 and the semiconductor element 6.

The substrate 5 may have an insulating substrate 520, and a conductive layer 521 and a heat transfer layer 522 which are respectively formed on an upper surface and a lower surface of the insulating substrate 520. The insulating substrate 520 electrically insulates the conductive layer 521 from the heat radiation plate 10 on the lower portion. For example, the insulating substrate 520 is a ceramic plate. The conductive layer 521 has a circuit formed of a copper foil and the like, and is electrically connected, by a solder 53, to the semiconductor element 6 on the upper portion. The heat transfer layer 522 is formed of metal such as copper, and is bonded to the heat radiation plate 10 via the solder 53.

The semiconductor element 6 may have electrodes on both surfaces, and for example, the electrode formed on the surface on the substrate 5 side may be electrically connected to the conductive layer 521, and the electrode formed on the surface opposite to the substrate 5 may be connected to the terminal 11 via a bonding wire 12 that is described below. As one example, if the semiconductor device 1 is a three-phase output inverter device, each semiconductor element 6 may be an IGBT (Insulated Gate Bipolar Transistor) and a FWD (Free Wheeling Diode) to configure an arm. In this case, the semiconductor element 6 may have an emitter electrode as a main electrode on the substrate 5 side, and have a collector electrode as the main electrode and a gate electrode and the like as control electrodes on the surface on the opposite side of the substrate 5, and the control electrode among the above may be connected to the terminal 11 via the below-described bonding wire 12. It should be noted that a connection for other electrodes and a circuit configuration of the semiconductor device 1 are described below in detail.

The heat radiation plate 10 cools the semiconductor element 6 via the substrate 5. For example, the heat radiation plate 10 may be a metal plate such as a copper plate, and may be adhered to the lower surface of the peripheral wall portion 302 of the first member 3 in a state of covering the inner bottom surface of the case 2.

The terminal 11 establishes conductive paths from the electrodes of the semiconductor element 6 (for example, the control electrodes such as the gate electrode of the IGBT) out of the case 2. For example, the terminal 11 may have a bent L shape and its midway portion may be embedded in the peripheral wall portion 302. Then, one end of the terminal 11 may extend upward from an upper end of the peripheral wall portion 302, and the other end may extend to the inside of the accommodation space 100 from the inner peripheral surface of the peripheral wall portion 302. As such a terminal 11, for example, copper, copper alloy (brass, phosphor bronze, C194 copper alloy, and the like), aluminum, and copper-aluminum clad material, which are conductively plated, can be used as a conductive material.

The bonding wire 12 electrically connects the control electrode on the upper surface of the semiconductor element 6 (for example, the gate electrode) to the terminal 11. It should be noted that the bonding wire 12 may electrically connect the control electrode to the terminal 11 via the conductive layer 521. As such a bonding wire 12, for example, a bonding wire made of aluminum can be used.

It should be noted that the accommodation space 100 in which the substrate 5, the semiconductor element 6, and the like are accommodated may be filled with a gel material 101 in order to protect the bonding wire 12, the terminal 11, the conductive layer 521, and the like. As the gel material 101, silicone gel and the like can be used.

[3. Fixation of First Member and Second Member]

FIG. 4 (a) to FIG. 4 (d) are the drawings for describing the fixation of the first member 3 and the second member 4. More specifically, FIG. 4 (a) and FIG. 4 (b) are the drawings showing a state in which the second member 4 is not fixed to the first member 3, and FIG. 4 (a) is a top view and FIG. 4 (b) is an A-A line cross-sectional view of FIG. 4 (a). Also, FIG. 4 (c) and FIG. 4 (d) are the drawings showing a state in which the second member 4 is fixed to the first member 3, and FIG. 4 (c) is a top view and FIG. 4 (d) is a B-B line cross-sectional view of FIG. 4 (c).

As shown in these FIG. 4 (a) to FIG. 4 (d), the protruding portion 350 is engaged with the notched portion 40 such that the first member 3 and the second member 4 are fixed to each other. For example, as shown in FIG. 4 (a) and FIG. 4 (b), the first member 3 may have, on an upper surface of a counterbore portion 310, the protruding portion 350 extending from the first member 3 side toward the second member 4 side in the state in which the first member 3 and the second member 4 are not fixed to each other.

This protruding portion 350 may be formed in a columnar shape and be formed having the end portion 351 tapered toward the upper-surface side. Accordingly, when causing the first member 3 and the second member 4 to face each other and be fit to each other, the work of passing the protruding portion 350 through the notched portion 40 of the second member 4 is facilitated. It should be noted that a cross-sectional shape of the protruding portion 350, more specifically, the cross-sectional shape within a surface orthogonal to the extending direction of the protruding portion 350 may be a similar shape to or may be a different shape from the shape of the notched portion 40 when viewed from the upper-surface side. As one example, the protruding portion 350 in the present embodiment is in a tapered square column shape and the cross-sectional shape is square-shaped.

As shown in FIG. 4 (c) and FIG. 4 (d), in the above protruding portion 350 in the state in which the first member 3 and the second member 4 are fixed to each other, the end portion 351 may be crushed, pressed and spread from the upper-surface side, and engaged with the notched portion 40 of the second member 4. Preferably, the end portion 351 of the protruding portion 350 may be radially pressed and spread within a surface crossing the extending direction of the protruding portion 350, and more preferably, may be equally pressed and spread in directions excluding a direction toward the inner wall of the aperture 30 among the all directions within the surface.

On the other hand, the second member 4 may have, on a side of the outer edge portion, a square-shaped notched portion 40 for passing the protruding portion 350 therethrough in the state in which the first member 3 and the second member 4 are not fixed to each other. As shown in FIG. 4 (c) and FIG. 4(d), this notched portion 40 may be engaged with the crushed end portion 351 of the protruding portion 350 in the state in which the first member 3 and the second member 4 are fixed to each other.

Also, the second member 4 may have a locking surface 42 in at least a part of, preferably in a plurality of parts of a position adjacent to the protruding portion 350 on the upper-surface side, in other words, a position adjacent to the notched portion 40 for passing the protruding portion 350 therethrough. This locking surface 42 is a surface locked by the crushed end portion 351 of the protruding portion 350, and is locked from the upper-surface side such that the second member 4 is not separated from the first member 3, for example. As one example, the locking surface 42 is provided inclinedly such that the second member becomes thinner toward the protruding portion 350 side. However, the locking surface 42 may be provided in a stair shape such that the second member 4 becomes thinner toward the protruding portion 350 side. Also, the upper surface itself of the second member may serve as the locking surface 42 without being formed partially inclinedly or formed on the stairs.

Also, the second member 4 may have a clearance portion 41 at least in a part of the position adjacent to the protruding portion 350. As shown in FIG. 4 (c) and FIG. 4 (d), this clearance portion 41 accommodate the crushed end portion 351 of the protruding portion 350 in the state in which the first member 3 and the second member 4 are fixed to each other. For example, the clearance portion 41 may be formed by providing a notch on the upper surface of the second member 4 in the position adjacent to the protruding portion 350, and as one example, may be formed such that the second member 4 becomes thinner toward the protruding portion 350 side by providing the above-described locking surface 42. In addition to/instead of this, the clearance portion 41 may be formed by providing the notch on a side end surface of the second member 4 in the position adjacent to the protruding portion 350, and as one example, may be formed by providing the above-described notched portion 40.

It should be noted that a volume of the space formed by the clearance portion 41 may be the same volume as that of the end portion 351 protruding on the opposite side of the first member 3 (the upper side of FIG. 4 (b)) more than the upper surface of the second member 4 in the protruding portion 350 in the state in which the first member 3 and the second member 4 are not fixed to each other. Accordingly, the crushed end portion 351 of the protruding portion 350 may be formed flush with the portion in the position adjacent to the protruding portion 350 of the portion on the upper-surface side of the second member 4. However, the volume of the space formed by the clearance portion 41 may be smaller than or may be larger than the volume of the end portion 351.

According to the above case 2, because the protruding portion 350 of the first member 3 extends from the first member 3 side toward the second member 4 side, the end portion 351 is crushed from the upper-surface side, and the second member 4 and the first member 3 are fixed to each other, the fixation can be performed simply by crushing the end portion 351 of the protruding portion 350. Therefore, compared to the case where the fixation is performed by the adhesive or the engaging claw, the apparatus manufacturing can be facilitated and the manufacture lead time can be shorten. Also, because it can be checked that the first member 3 and the second member 4 are fixed to each other by visual observation of the crushed end portion 351 of the protruding portion 350, fixing failure detection can be facilitated.

[4. Circuit Configuration]

Figure 5:
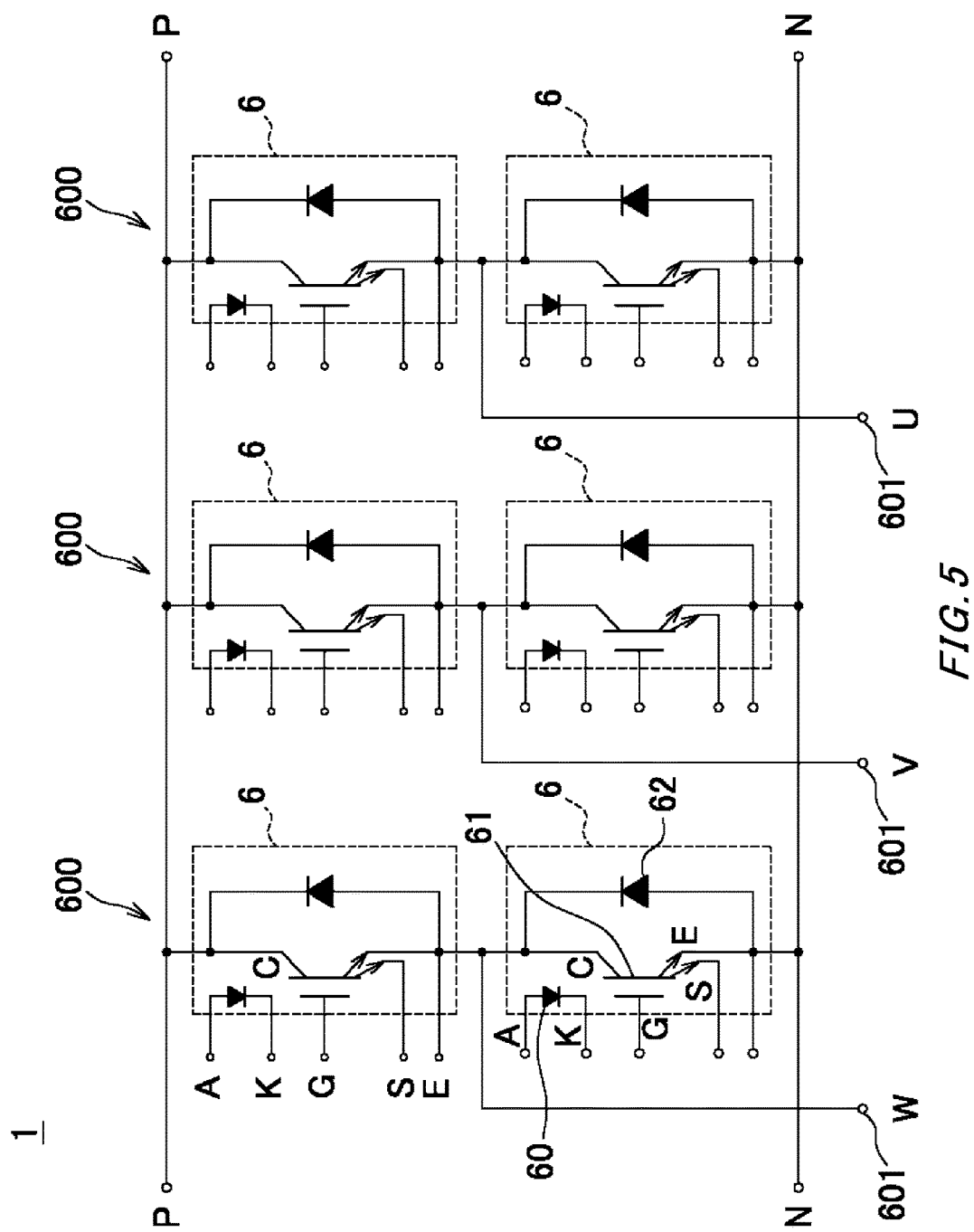
FIG. 5 is a circuit diagram showing the semiconductor device according to the present embodiment.

FIG. 5 is a circuit diagram showing the semiconductor device 1 according to the present embodiment. As shown in this drawing, for example, the semiconductor device 1 is a three-phase output inverter device, and has six semiconductor elements 6 as arms for performing switching.

As one example, the semiconductor element 6 has a temperature sensing diode 60 and an RC-IGBT (Reverse Conducting IGBT) element 61. The temperature sensing diode 60 is for sensing a temperature of a substrate of the semiconductor element 6. This temperature sensing diode 60 has an anode electrode (A) and a cathode electrode (K) as the control electrodes on the substrate 5 side, and is set to be capable of measuring the temperature of the substrate by measuring a forward voltage.

The RC-IGBT element 61 has an emitter electrode (E) as a second electrode, a gate electrode (G), a sense-emitter electrode (S), and the emitter electrode (E) as the control electrodes on the opposite side of the substrate 5, and has a collector electrode (C) as a first electrode on the substrate 5 side. It should be noted that the emitter electrode (E) is used as the second electrode and as the control electrode. Also, a free wheel diode 62 is connected between the emitter electrode (E) and the collector electrode (C), which causes currents to flow from the emitter electrode (E) toward the collector electrode (C).

Two semiconductor elements 6 make a pair to configure a leg 600. Then, a positive electrode (P) of a DC power source is electrically connected to the collector electrode (C) of one of the semiconductor elements 6 (the semiconductor element 6 on the upper side in the drawing; also referred to as an upper arm) of each leg 600. Also, a negative electrode (N) of the DC power source is electrically connected to the emitter electrode (E) of the other semiconductor element (the semiconductor element 6 on the lower side in the drawing; also referred to as a lower arm). For example, the positive electrode (P) and the negative electrode (N) may be provided penetrating through the peripheral wall portion 302 of the case 2.

Also, the emitter electrode (E) of the semiconductor element 6 being the upper arm and the collector electrode (C) of the semiconductor element 6 being the lower arm are electrically connected to each other. In this connecting portion, an external output terminal 601 is electrically connected. For example, the external output terminal 601 may be provided penetrating through the peripheral wall portion 302 of the case 2.

Also, conductive paths from the control electrodes of each semiconductor element 6 (for example, the gate electrode (G), the sense-emitter electrode (S), the emitter electrode (E), the anode electrode (A), and the cathode electrode (K)) are established out of the case 2 via the above-described bonding wire 12 and terminal 11.

In the semiconductor device 1 of such a circuit configuration, as a control signal is input to the gate terminal (G) of each semiconductor element 6 while a direct-current power is applied between the positive electrode and the negative electrode, a switching operation of the RC-IGBT element 61 of the semiconductor element 6 is controlled. Accordingly, U-phase, V-phase, and W-phase alternating-current signals are output from the external output terminals 601 of three legs 600. It should be noted that if the temperature measured by the temperature sensing diode 60 is higher than a reference temperature, the control may be performed so as to reduce heat generation by reducing the emitter currents and the like.

[5. Manufacturing Method of Case]

Figure 6:
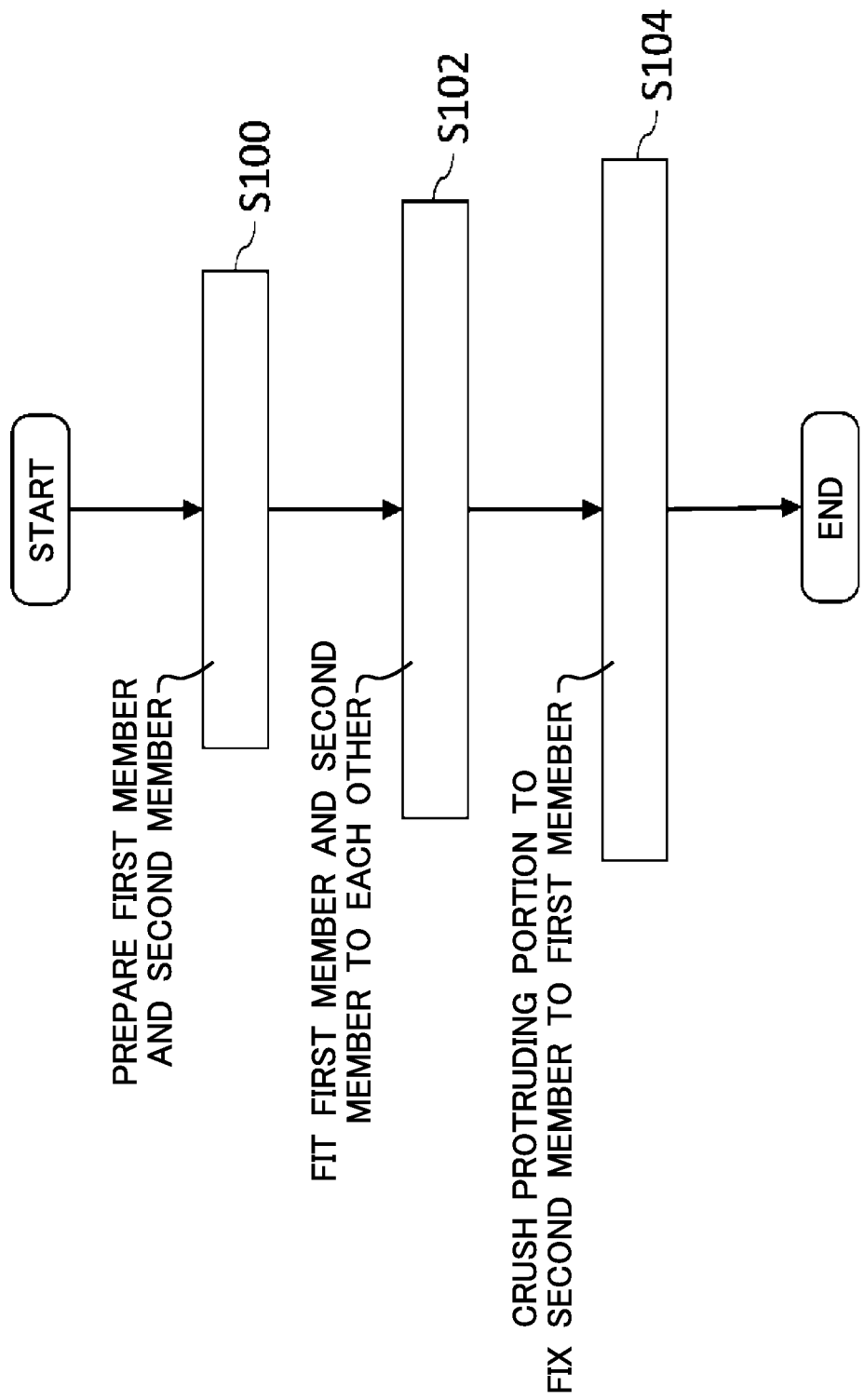
FIG. 6 is a flowchart for describing a manufacturing method of the case according to the present embodiment.

Next, a manufacturing method of the case 2 is described. FIG. 6 is a flowchart for describing the manufacturing method of the case 2 according to the present embodiment.

As shown in this drawing, for manufacturing the case 2, first, the first member 3 and the second member 4 are prepared (S100). For example, when forming the protruding portion 350 of the first member 3, the end portion 351 of the protruding portion 350 may be formed having a tapered top portion. Accordingly, at S102 that is described below, when causing the first member 3 and the second member 4 to face each other and be fit to each other, the work of passing the protruding portion 350 through the notched portion 40 of the second member 4 is facilitated.

Here, the substrate 5, the semiconductor element 6, and the like may be accommodated in the inside of the prepared first member 3. Also, the heat radiation plate 10 may be adhered to the lower surface of the peripheral wall portion 302 of the first member 3. Further, a recessed portion formed by the first member 3 and the heat radiation plate 10 may be filled with the gel material 101. When preparing the first member 3 in a state in which the terminal 11 is embedded, a so-called insert-molding method may be used, for example, resin is injected in a mold and solidified after arranging the terminal 11 within the mold for molding the first member 3.

Next, the first member 3 and the second member 4 are fit to each other (S102). For example, the second member 4 may be fit to a frame portion 31 of the first member 3. Accordingly, the accommodation space 100 may be formed by the first member 3 and the second member 4. Also, the protruding portion 350 of the first member 3 may be passed through the notched portion 40 of the second member 4, and the end portion 351 of the protruding portion 350 may protrude on the opposite side of the first member 3 more than the locking surface 42 of the second member 4.

Next, the end portion 351 of the protruding portion 350 of the first member 3 is crushed to fix the second member 4 to the first member 3 (S104). For example, the end portion 351 may be deformed and crushed by at least one of ultrasonic excitation and heating. It should be noted that at this time, the deformed end portion 351 may be integrated with or may not be integrated with the second member 4.

Here, if the end portion 351 is deformed by heating, a heat caulking apparatus can be used, for example. Also, if the end portion 351 is deformed by the ultrasonic excitation, an ultrasonic caulking apparatus and the like can be used, for example. The ultrasonic caulking apparatus causes the end portion 351 to be melt and deformed by applying a vibration to the end portion 351 of the protruding portion 350 from a resonator that is called a horn.

Because a deformation speed control is easy in a case of using the ultrasonic excitation for deforming the end portion 351 compared to a case of using the heating, the end portion 351 can be readily deformed in a desired shape. Also, because the solidification of the end portion 351 after deformed can be speeded up, a position of the second member 4 relative to the first member 3 during a period until the solidification can be prevented from shifted. Also, an appearance of a product can be improved.

According to the above S100 to S104, the case 2 is manufactured. Here, after the case 2 is manufactured, it may be determined, by the visual observation from the outside of the case 2, that the first member 3 and the second member 4 are fixed to each other.

For example, under a condition that the protruding portion 350 being spread in the top surface view is visually observed, it may be determined that the first member 3 and the second member 4 are fixed to each other. Also, under a condition that the protruding portion 350 being spread in the top surface view and being covering the notched portion 40 is visually observed, it may be determined that the first member 3 and the second member 4 are fixed to each other. In these cases, in order to easily check the spreading way of the protruding portion 350, the protruding portion 350 may be colored in advance in a different color from that of the second member 4, or the protruding portion 350 may be set to be discolored due to the deformation.

Also, if the protruding portion 350 is discolored due to the deformation, it may be determined that the first member 3 and the second member 4 are fixed to each other under a condition that the discoloring is visually observed irrelevant to the spreading way of the protruding portion 350 in the top surface view.

However, a member to cover the end portion 351 may be provided on the case 2 such that the crushed end portion 351 of the protruding portion 350 is not seen from the upper-surface side. For example, a color film may be stuck to the whole upper surface of the second member 4, or a cover member for covering the protruding portion 350 may be provided in the vicinity of the protruding portion 350 of the first member 3 and/or the second member 4.

According to the above manufacturing method, because the second member 4 is fixed to the first member 3 by crushing the end portion 351 of the protruding portion 350 provided on the first member 3 and extending from the first member 3 side to the second member 4 side, it can facilitate the apparatus manufacturing and shorten the manufacture lead time compared to the case of performing the fixation by the adhesive or the engaging claw. Also, because it can be checked that the first member 3 and the second member 4 are fixed to each other by visually observing the crushed end portion 351 of the protruding portion 350, the fixing failure detection can be facilitated.

[6. Variations]

Next, variations of the above-described embodiments are described.

[6-1. Variation (1)]

Figure 7A:
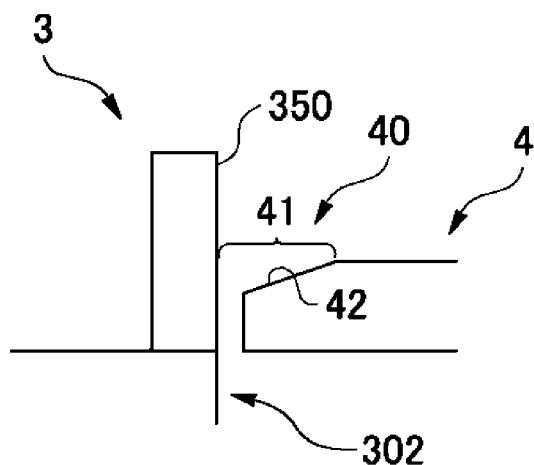
FIG. 7 (a) is a side view of a protruding portion in a variation (1).
Figure 7B:
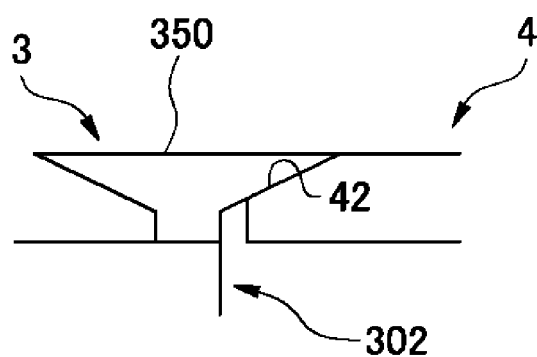

FIG. 7 (*a*) and FIG. 7 (*b*) are side views of the protruding portion 350 in the variation (1). More specifically, FIG. 7 (*a*) shows the protruding portion 350 in the state in which the first member 3 and the second member 4 are not fixed to each other. Also, FIG. 7 (*b*) shows the protruding portion 350 in the state in which the first member 3 and the second member 4 are fixed to each other.

As shown in these drawings, the protruding portion 350 may be provided being separated from an inner peripheral portion of the frame portion 31 (not shown in FIGS. 7 (*a*) and (*b*)) and being on the peripheral wall portion 302. Also, as shown in FIG. 7 (*b*), in the state in which the first member 3 and the second member 4 are fixed to each other, the end portion 351 may be crushed from the upper-surface side, be pressed and spread respectively toward the inner side and the outer side of the frame portion 31, and be engaged with the notched portion 40 of the second member 4.

[6-2. Variation (2)]

Figure 8A:
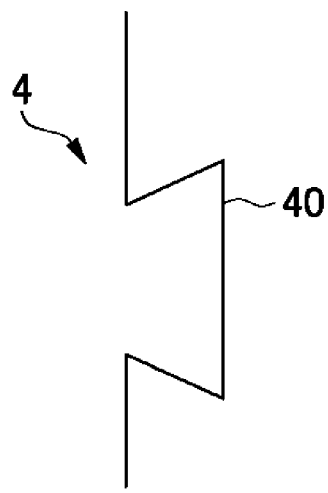
FIG. 8 (a) is a drawing showing a notched portion in a variation (2).
Figure 8B:
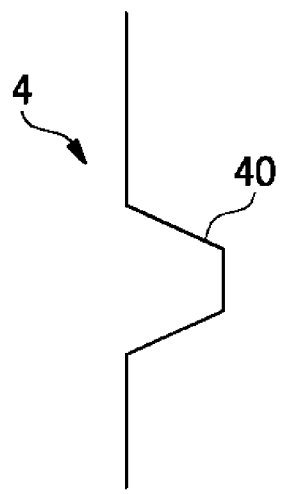
Figure 8C:
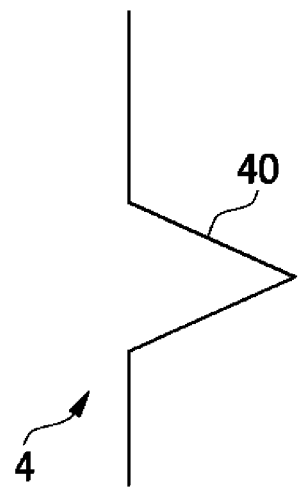

FIG. 8 (*a*) to FIG. 8 (*c*) are the drawings showing the notched portion 40 in the variation (2). As shown in these drawings, the shape of the notched portion 40 when viewed from the upper-surface side may be a polygonal shape that is different from the square shape. For example, the notched portion 40 may be in a trapezoid shape as shown in FIG. 8 (*a*) and FIG. 8 (*b*), or may be in a triangular shape as shown in FIG. 8 (*c*).

Also, the notched portion 40 when viewed from the upper-surface side may be in a shape in which a portion closer to a side of the second member 4 is narrower than a portion farther from the side, that is, a shape narrower toward the side (refer to FIG. 8 (*a*)). In this case, because the portion on the side far from the second member 4 of the outer periphery of the protruding portion 350 is surrounded by the notched portion 40, the first member 3 and the second member 4 are firmly fixed to each other.

Also, the notched portion 40 when viewed from the upper-surface side may be in a shape in which the portion closer to the side of the second member 4 is wider than the portion farther from the side, that is, a shape spread toward the side (refer to FIG. 8 (*b*) and FIG. 8 (*c*)). In this case, when causing the first member 3 and the second member 4 to face each other and be fit to each other, the work of passing the protruding portion 350 through the notched portion 40 of the second member 4 is facilitated.

[6-3. Variation (3)]

Figure 9A:
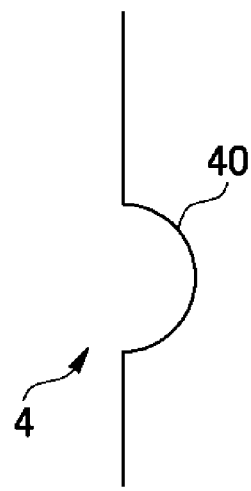
FIG. 9 (a) is a drawing showing a notched portion in a variation (3).
Figure 9B:
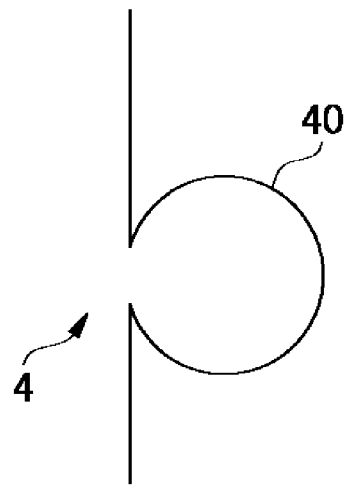

FIG. 9 (*a*) and FIG. 9 (*b*) are the drawings showing the notched portion 40 in the variation (3). As shown in these drawings, the shape of the notched portion 40 when viewed from the upper-surface side may be partially circular.

For example, the notched portion 40 may be in a semicircular shape as shown in FIG. 9 (*a*), or may be in a partially circular shape larger than a semicircle as shown in FIG. 9 (*b*). Also, the notched portion 40 may be in a partially circular shape smaller than a semicircle. If the notched portion 40 is in the partially circular shape smaller than the semicircle, when causing the first member 3 and the second member 4 to face each other and be fit to each other, the work of passing the protruding portion 350 through the notched portion 40 of the second member 4 is facilitated. Also, a stress concentration to the portion in which the notched portion 40 and the protruding portion 350 are engaged with each other is prevented. On the other hand, if the notched portion 40 is in the partially circular shape larger than the semicircle, the first member 3 and the second member 4 are firmly fixed to each other.

[6-4. Variation (4)]

Figure 10A:
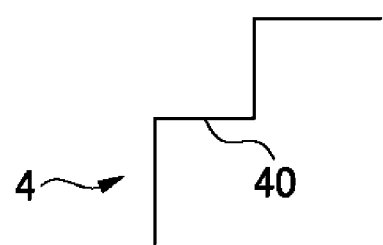
FIG. 10 (a) is a drawing showing a notched portion in a variation (4).
Figure 10B:
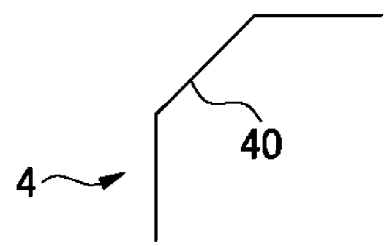
Figure 10C:
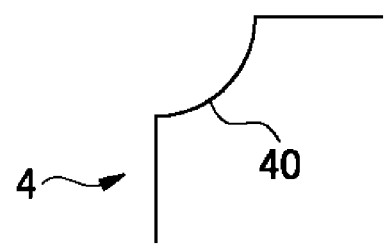

FIG. 10 (*a*) to FIG. 10 (*c*) are the drawings showing the notched portion 40 in the variation (4). As shown in these drawings, the notched portion 40 may be provided in a corner portion of the outer edge portion of the second member 4. For example, the shape of this notched portion 40 when viewed from the upper-surface side may be a polygonal shape. As one example, the shape of the notched portion 40 when viewed from the upper-surface side may be a square shape as shown in FIG. 10 (*a*), or may be a triangular shape as shown in FIG. 10 (*b*). Also, the notched portion 40 may be partially circular as shown in FIG. 10 (*c*). It should be noted that if the notched portion 40 is provided in the corner portion of the outer edge portion of the second member 4, the protruding portion 350 may be formed on the corner portion of the frame portion 31.

[6-5. Variation (5)]

Figure 11:
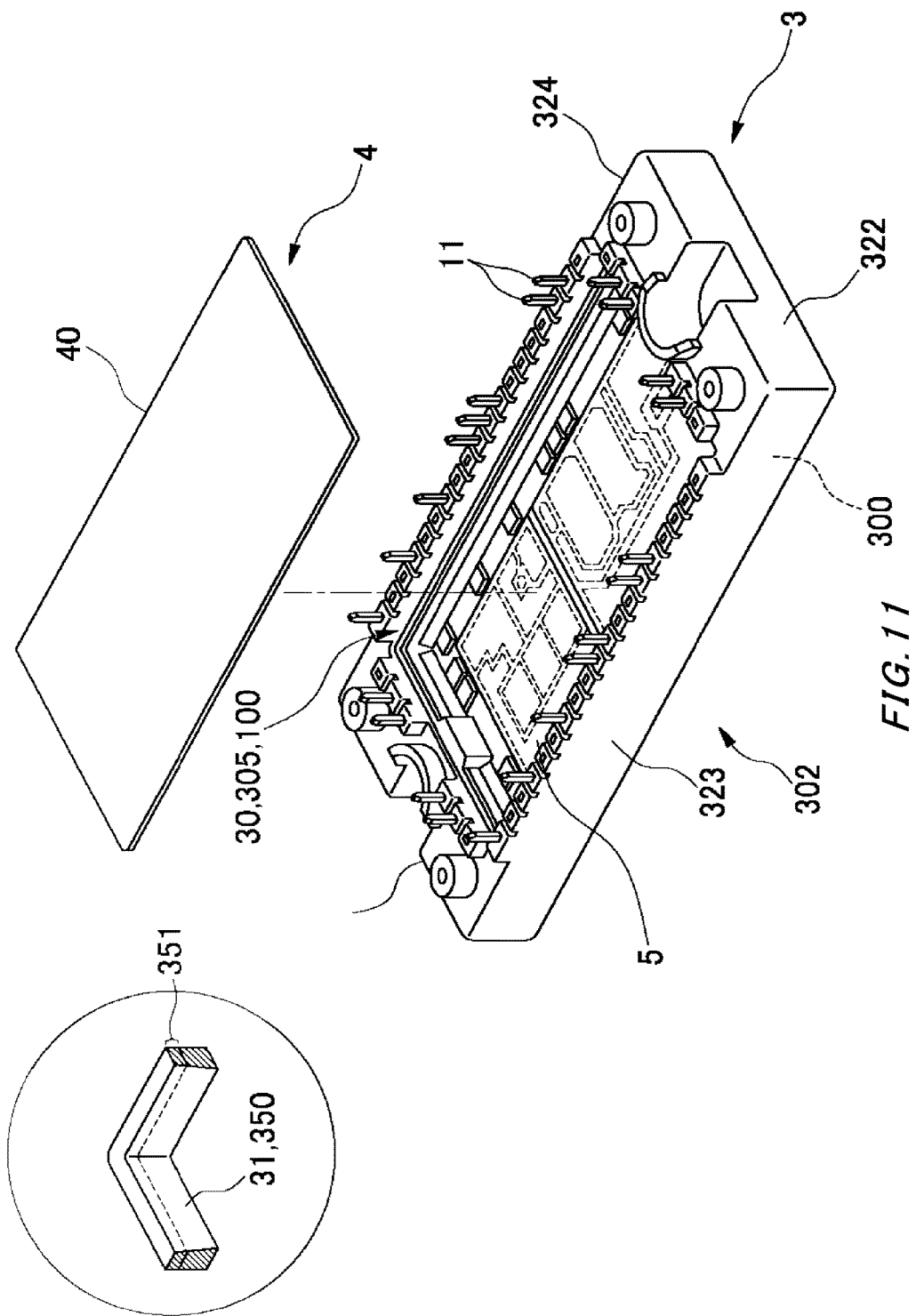
FIG. 11 is a drawing showing a notched portion and a protruding portion in a variation (5).

FIG. 11 is the drawing showing the notched portion 40 and the protruding portion 350 in the variation (5). As shown in this drawing, the notched portion 40 may be uniformly formed over the whole periphery of the second member 4. In other words, the second member 4 may be formed small simply corresponding to the size of the notched portion 40.

Also, the protruding portion 350 may surround the entire outer periphery of the second member 4 in the state in which the first member 3 and the second member 4 face each other and are fit to each other. For example, the protruding portion 350 may be formed over the whole periphery of the frame portion 31. As one example, the protruding portion 350 may be formed as the frame portion 31, or may have the end portion 351 on the upper-surface side. This end portion 351 may be formed so as to become thinner toward the opposite side of the first member 3. Also, when the second member 4 is fit to the frame portion 31, the end portion 351 may protrude on the opposite side of the first member 3 more than the upper surface of the second member 4. Also, this end portion 351 may be engaged with the second member 4 over the entire outer periphery of the second member 4 to fix the second member 4 to the first member 3 by crushing the end portion 351 from the opposite side of the first member 3.

[6-6. Variation (6)]

Figure 12A:
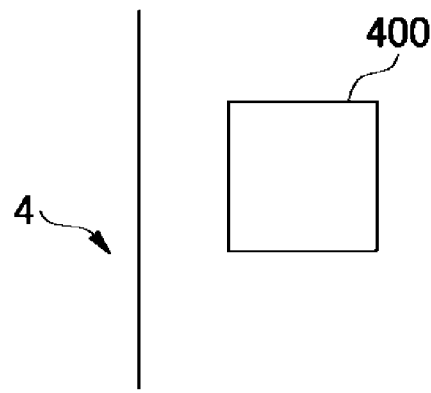
FIG. 12 (a) is a drawing showing a second member in a variation (6).
Figure 12B:
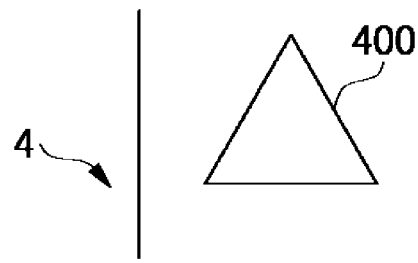
Figure 12C:
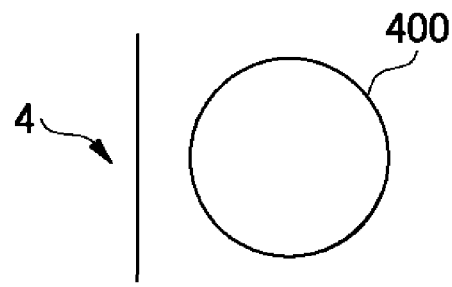

FIG. 12 (a) to FIG. 12 (c) are the drawings showing the second member 4 in the variation (6). As shown in these drawings, the second member 4 may have a through hole 400 for passing the protruding portion 350 therethrough in addition to/instead of the notched portion 40 of the outer edge portion. For example, the shape of this through hole 400 when viewed from the upper-surface side may be a polygonal shape. As one example, the shape of the through hole 400 when viewed from the upper-surface side may be a square shape as shown in FIG. 12 (a), or may be a triangular shape as shown in FIG. 12 (b). Also, the through hole 400 may be circular as shown in FIG. 12 (c). Also, the through hole 400 may be provided in the outer peripheral portion of the second member 4, or may be provided in a central portion.

It should be noted that if the through hole 400 is provided in the second member 4, the protruding portion 350 is provided on an opposite position to the through hole 400 of the first member 3. For example, the protruding portion 350 may be provided on the upper surface of the counterbore portion 310, or may be provided on the bottom surface of the accommodation space 100 (for example, the upper surface of the heat radiation plate 10), or may be provided protruding on the inner side from the inner peripheral surface of the peripheral wall portion 302 (for example, the inner peripheral surface of the frame portion 31). Also, the protruding portion 350 may be provided on the upper surface of a beam member (not shown in the drawings) provided across the accommodation space 100 within the case 2.

[6-7. Variation (7)]

Figure 13:
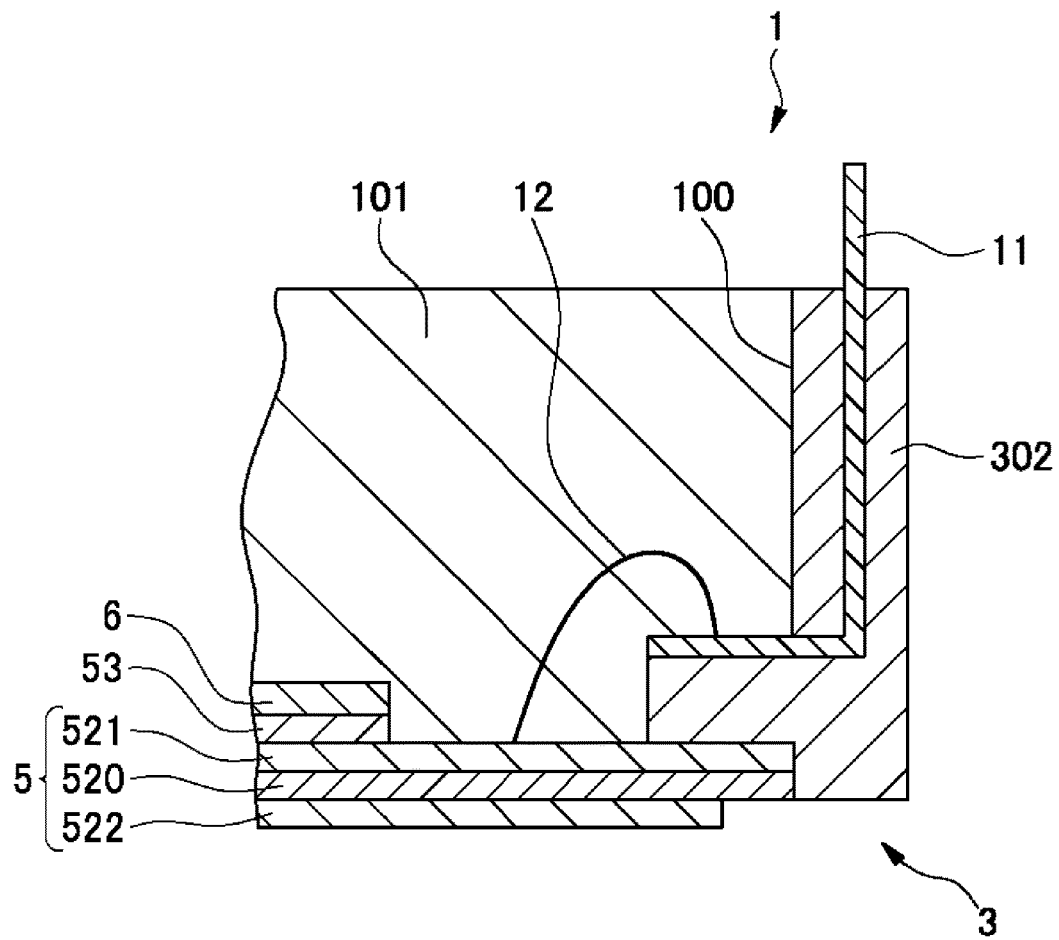
FIG. 13 is a cross-sectional view showing a state in which a substrate and a semiconductor element are accommodated within a case in a semiconductor device according to a variation (7).

FIG. 13 is a cross-sectional view showing the state in which the substrate 5 and the semiconductor element 6 are accommodated within the case 2 in the semiconductor device 1 according to the variation (7).

As shown in this drawing, the semiconductor device 1 may not have the heat radiation plate 10. For example, a heat transfer layer 522 of the substrate 5 may not be exposed on the opposite side of the second member 4 (the lower side) on the inner side of the peripheral wall portion 302 of the case 2. The insulating substrate 520 and the peripheral wall portion 302 may be secured to each other by an adhesive.

[6-8. Other Variations]

It should be noted that although it has been described that the first member 3 has the peripheral wall portion 302 forming the accommodation space 100 in the above-described embodiments and variations, the first member 3 may further have a bottom portion. Also, this bottom portion may be integrally molded by the same resin or the same type of resin as that of the peripheral wall portion 302, or may be formed of another material and adhered.

Also, although it has been described that the second member 4 and the first member 3 are fixed to each other in the state in which the second member 4 is fit to the frame portion 31 of the first member 3, the second member 4 and the first member 3 may be fixed to each other in the state in which the second member 4 is placed on the upper-surface side of the first member 3. In this case, the protruding portion 350 may be formed on the upper surface of the peripheral wall portion 302.

Also, although the first member 3 has been described as the case body and the second member 4 has been described as the lid body, the first member 3 and the second member 4 may be set as members in other shapes, provided that the first member 3 and the second member 4 are engaged with each other to form the accommodation space 100 inside the case. For example, the first member 3 is set as a plate-shaped base member, and the second member 4 may be set as a recessed (Ω-shaped, as one example) member having an aperture on the first member 3 side. In this case, the second member 4 has the notched portion 40 and/or the through hole 400 on the outer peripheral portion, and the first member 3 may have the protruding portion 350 in a corresponding position of the notched portion 40 and the through hole 400.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A case, comprising:
    a first member; and
    a second member that is engaged with the first member to form accommodation space inside the case, wherein
    the first member is a case body having:
        a peripheral wall portion that forms an aperture of the accommodation space;
        a terminal that is embedded in the peripheral wall portion and extends in a height direction of the peripheral wall portion toward the second member side; and
        a frame portion that is provided on an inner peripheral portion of the peripheral wall portion to accommodate the second member, and the first member has a protruding portion that extends from the first member side toward the second member side, the protruding portion having an end portion crushed from an opposite side of the first member to fix the second member to the first member, wherein the protruding portion is provided corresponding to a part of an outer edge portion of the second member and extends in parallel with the terminal along an inner surface of the frame portion, and the second member is a lid body that is fit to the frame portion to cover the accommodation space.

2. The case according to claim 1, wherein
the second member has a notched portion for passing the protruding portion therethrough on a side of the outer edge portion of the second member.

3. The case according to claim 2, wherein
a shape of the notched portion when viewed from the opposite side of the first member is either a polygonal shape or a partially circular shape.

4. The case according to claim 1, wherein
the second member has a notched portion for passing the protruding portion therethrough in a corner portion of the outer edge portion of the second member.

5. The case according to claim 1, wherein
the protruding portion surrounds an entire outer periphery of the second member.

6. The case according to claim 1, wherein
the second member has a through hole to pass the protruding portion therethrough.

7. The case according to claim 6, wherein
a shape of the through hole when viewed from the opposite side of the first member is either a polygonal shape or a circular shape.

8. The case according to claim 1, wherein
the second member has, at least in a part of a position adjacent to the protruding portion on the opposite side of the first member, a locking surface to be locked by the end portion of the protruding portion, the end portion crushed from the opposite side of the first member.

9. The case according to claim 8, wherein the second member has the locking surface on a plurality of portions in the position adjacent to the protruding portion on the opposite side of the first member.

10. The case according to claim 1, wherein
the second member has, at least in a part of a position adjacent to the protruding portion, a clearance portion to accommodate the end portion of the protruding portion, the end portion crushed from the opposite side of the first member.

11. The case according to claim 10, wherein
the end portion of the protruding portion, which is crushed from the opposite side of the first member, is formed flush with a portion in the position adjacent to the protruding portion of the portion of the second member on the opposite side of the first member.

12. The case according to claim 1, wherein
the protruding portion is formed of thermoplastic resin.

13. A semiconductor device, comprising:
the case according to claim 1;
a substrate that is accommodated in the accommodation space of the case; and
a semiconductor element that is mounted on the substrate.

14. The semiconductor device according to claim 13, further comprising:
a gel material to seal an upper side of the substrate within the accommodation space.

15. A manufacturing method of a case, the case including a first member and a second member engaged with the first member to form an accommodation space inside the case, the manufacturing method of the case comprising:

preparing the first member, wherein the first member is a case body having a peripheral wall portion that forms an aperture of the accommodation space, a terminal that is embedded in the peripheral wall portion and extends in a height direction of the peripheral wall portion toward the second member side, and a frame portion that is provided on an inner peripheral portion of the peripheral wall portion to accommodate the second member, and the first member has a protruding portion that extends from the first member side toward the second member side, the protruding portion provided corresponding to a part of an outer edge portion of the second member and extending in parallel with the terminal along an inner surface of the frame portion;

preparing the second member, wherein the second member is a lid body that is fit to the frame portion to cover the accommodation space;

fitting the first member and the second member to each other; and fixing the second member to the first member by crushing an end portion of the protruding portion, which protrudes on a surface of the second member on an opposite side of the first member.

16. The manufacturing method according to claim 15, wherein
the fixing the second member to the first member includes:
crushing the end portion by at least one of ultrasonic excitation and heating.

17. The manufacturing method according to claim 15, wherein
the preparing the first member and the second member includes:
forming a tapered top portion on the end portion before the crushing.

* * * * *